United States Patent [19]

Bennett

[11] Patent Number: 4,938,993

[45] Date of Patent: Jul. 3, 1990

[54] PROTECTIVE COATINGS FOR ALLOYS

[75] Inventor: Michael J. Bennett, South Moreton, United Kingdom

[73] Assignee: United Kingdom Atomic Energy Authority, Oxfordshire, England

[21] Appl. No.: 330,041

[22] Filed: Mar. 29, 1989

[30] Foreign Application Priority Data

Apr. 5, 1988 [GB] United Kingdom ............. 8807868.8

[51] Int. Cl.$^5$ ............................................. B05D 3/06
[52] U.S. Cl. ..................................... 427/38; 148/279; 148/280; 148/285; 427/383.9
[58] Field of Search ............... 427/38, 383.9; 428/630, 428/63; 148/279, 280, 285

[56] References Cited

U.S. PATENT DOCUMENTS 4,778,721 10/1988 Sliemers et al. ...................... 427/38

FOREIGN PATENT DOCUMENTS 56-156777 12/1981 Japan .................................. 148/285
61-149472  7/1986 Japan .................................. 148/285
   518533 12/1974 U.S.S.R. ........................... 427/383.9

Primary Examiner—Stanley Silverman
Attorney, Agent, or Firm—Larson and Taylor

[57] ABSTRACT

Aluminium-containing alloys are protected against high temperature corrosive attack by providing an amorphous silica coating, e.g. by plasma assisted vapor deposition, followed by heat treating under conditions such that a coherent, protective alumina coating or layer is formed on the surface of the alloy in place of the silica coating. The silica protects the alloy from corrosion initially and then acts as an oxidant source so that aluminium from the alloy can react to form the alumina coating. The alloy may be a superalloy such as a nickel-base superalloy.

3 Claims, 1 Drawing Sheet

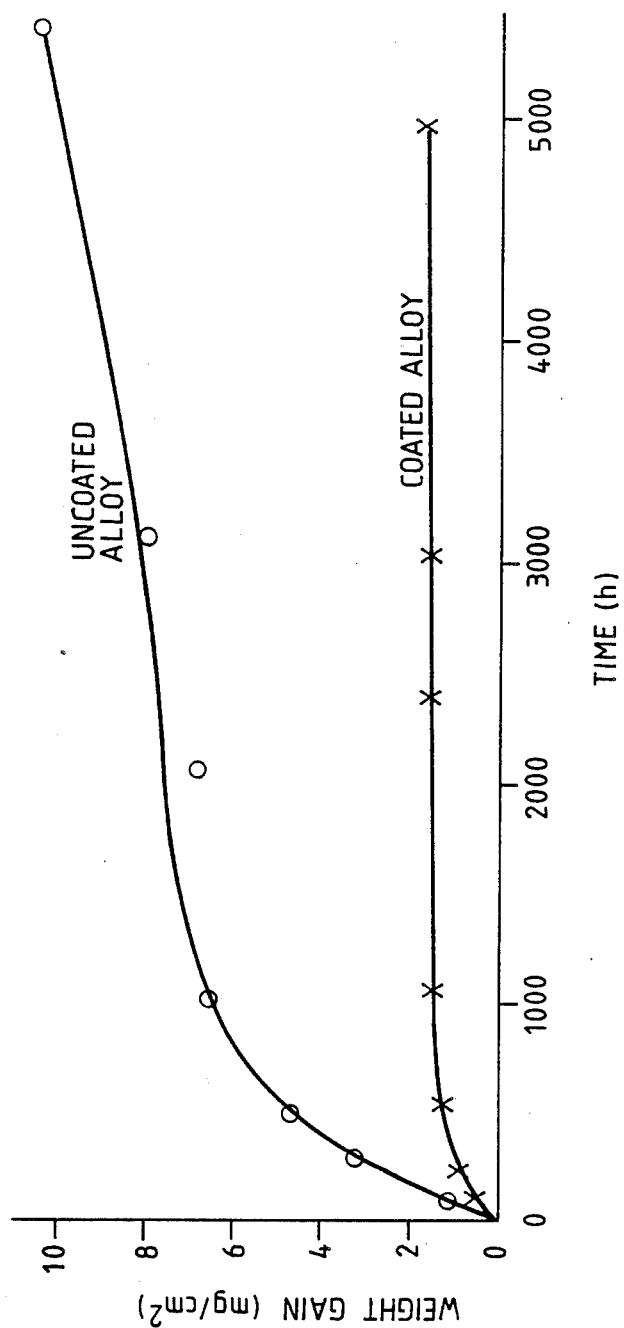

PROTECTIVE COATINGS FOR ALLOYS

This invention relates to the provision of aluminium-containing alloys with protective surface coatings.

Many technologically important alloys require protection against corrosion for certain of their applications. This may be done, for example, by providing the alloy with an externally applied protective surface coating or by heat treating the alloy in a gaseous oxidising atmosphere to generate a protective surface coating, e.g. of alumina or chromia, by the selective oxidation of elements in the alloy, where alumina is a preferred coating for providing high temperature protection. However, certain alloys, in the interests of their required mechanical properties, may possess insufficient aluminium to enable a satisfactory alumina coating to be generated by heat treating in an oxidising atmosphere.

The invention attempts to meet these difficulties and includes a method of providing an aluminium-containing alloy with a protective surface coating substantially of alumina which comprises (i) coating a surface of the alloy with an adherent, amorphous coating of silica; and (ii) heat treating the coated alloy under conditions such that a coherent, protective alumina coating is formed on the surface of the alloy.

The invention is particularly suitable where the alloy contains insufficient aluminium for it to form a protective alumina coating by heating in an oxidising atmosphere. Preferred alloys are aluminium-containing superalloys, namely high temperature alloys based on, for example, Fe, Cr, Co, Mn and/or Ni, preferably Ni-base superalloys. In a specific example to be described hereinafter, the present invention has been found to protect superalloys against corrosion at temperatures of up to 1000° C. The invention is therefore potentially applicable to protecting alloy artefacts such as turbine components that are likely to be exposed to high temperatures in use.

In step (i), the silica coating may be provided by vapour deposition coating techniques known in the art, of which plasma assisted vapour deposition, abbreviated herein to PAVD, is preferred. PAVD is a method of providing high integrity coatings on a substrate by decomposing a mixture of gases in a radio frequency glow discharge in a soft vacuum. Thus, in contrast to chemical vapour deposition, high temperatures are not required. Also, ion bombardment causes good adhesion of the coating to the substrate. PAVD is described in, for example, UK Patent Specification No 2 078 699 A.

In step (i), the silica coating may have a thickness of about 20 micrometers or less, for example 10 micrometres or less, and may he provided by PAVD using the mixture of gases comprises a silane such as monosilane and an oxidant such as carbon dioxide.

In step (ii) it is believed that, under certain conditions, the oxygen partial pressure at the interface between the alloy and the silica coating becomes sufficiently high to oxidise aluminium which diffuses from within the body of the alloy to the surface where it forms an alumina coating or layer. The alumina coating is formed at the expense of the silica coating: oxygen is believed to be removed therefrom and the silicon thereby generated to diffuse into the body of the alloy. The silica coating therefore has two functions: it protects the alloy before the alumina coating is formed and acts as an oxidant source to enable the alumina coating to be formed. It thus acts as a sacrificial coating.

The conditions under which the alumina coating is formed may have to be determined experimentally in individual cases. Factors affecting its formation may include temperature, time of heating, composition of gaseous environment, properties of the silica coating and the composition of the alloy, particularly aluminium concentration. For example, a temperature of greater than 800° C. may be necessary in order to form the alumina coating.

This invention will now be particularly described by way of example as follows. Reference will be made to the accompanying drawing, the sole FIGURE of which is a graph showing the relationship between weight gain and time at elevated temperature for an uncoated alloy and for an alloy treated according to the present invention.

EXAMPLE

A Ni-base superalloy of the composition by weight 16% Cr, 3.4% Al, 3.4% Ti, 8% Co, 2.5% w, balance Ni and identified as IN738LC was treated as follows. A silica coating of about 10 micrometres thickness was applied thereto by PAVD using a mixture of $SiH_4$ and $CO_2$ and the method and apparatus substantially as described in UK Patent Specification No 2 078 699 A.

The coated alloy was heat treated at 1000° C. in air and its weight gain measured as a function of time. Also, the structure of the coated alloy was examined micrographically before heat treatment and after heat treatment for 5000 hours at 1000° C. Further, by way of comparison, the same alloy—but uncoated—was heat treated as described above and its weight gain measured as a function of time.

Results

The micrographic examination showed that the coated alloy had an adherent, coherent coating of silica before heat reatment. It further showed, supported by silicon and aluminium X-ray images, that after the heat treatment, an adherent alumina coating had formed on the alloy surface underneath the silica coating which had degraded. Referring to the FIGURE, oxidative corrosion, as measured by weight gain, is seen to be very marked for the uncoated alloy undergoing breakaway, uncontrolled attack, whereas the coated alloy is seen to be effectively protected.

I claim:

1. A method of providing an aluminum-containing nickel-base superalloy with a protective surface coating substantially of alumina which comprises
    (i) coating a surface of the alloy with an adherent, amorphous coating of silica by a vapour depositing coating technique; and
    (ii) heat treating the coated alloy at a temperature greater than 800° C. under conditions such that a coherent, protective alumina coating is formed on the surface of the alloy.

2. A method according to claim 1 wherein the aluminium content of the alloy is such that the alloy is incapable of forming a protective alumina coating when heated in a gaseous oxidising atmosphere.

3. A method according to claim 1 wherein the coating of silica is provided by plasma activated vapour deposition.

* * * * *